(12) United States Patent
Galton et al.

(10) Patent No.: US 6,816,100 B1
(45) Date of Patent: Nov. 9, 2004

(54) ANALOG-TO-DIGITAL CONVERTERS WITH COMMON-MODE REJECTION DYNAMIC ELEMENT MATCHING, INCLUDING AS USED IN DELTA-SIGMA MODULATORS

(75) Inventors: Ian Galton, Del Mar, CA (US); Eric Fogelman, San Diego, CA (US); Henrick T. Jensen, Long Beach, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/523,509

(22) Filed: Mar. 10, 2000

Related U.S. Application Data
(60) Provisional application No. 60/124,245, filed on Mar. 12, 1999.

(51) Int. Cl.[7] .................................................. H03M 1/12
(52) U.S. Cl. ........................ 341/155; 341/143; 341/144
(58) Field of Search ................................. 341/155, 144, 341/143

(56) References Cited

U.S. PATENT DOCUMENTS

| | | |
|---|---|---|
| 4,147,971 A | 4/1979 | Price |
| 4,338,591 A | 7/1982 | Tuthill |
| 4,439,756 A | 3/1984 | Shenoi et al. |
| 4,481,597 A | 11/1984 | Robbins |
| 4,491,825 A | 1/1985 | Tuthill |
| 4,539,675 A | 9/1985 | Fisher |
| 4,588,981 A | 5/1986 | Senn |
| 4,590,458 A | 5/1986 | Evans et al. |
| 4,654,815 A | 3/1987 | Marin et al. |
| 4,736,188 A | 4/1988 | Jackson |
| 4,768,018 A | 8/1988 | Noujaim |
| 4,775,852 A | 10/1988 | Sloane |
| 4,958,139 A | 9/1990 | Hyatt |

(List continued on next page.)

OTHER PUBLICATIONS

Fogleman E, et al "An Area–Efficient Differential Input ADC with Digital Common Mode Rejection," Proceedings of the IEEE International Symposium on Circuits and Systems, IEEE, Jun. 1999, 4 pages.*

Baird et al.; Improved $\Delta\Sigma$ DAC Linearity Using Data Weighted Averaging; Proceedings of the IEEE International Symposium on Circuits and Systems; May 1995.

Baird et al.; Linearity enhancement of multi–bit $\Delta\Sigma$ A/D and D/A converters using data weighted averaging; IEEE Trans. On Circuits and Systems II: Analog and Digital Signal Processing, vol. 42, No. 12, pp. 753–762; Dec. 1995.

(List continued on next page.)

*Primary Examiner*—Michael Tokar
*Assistant Examiner*—Lam T. Mai
(74) *Attorney, Agent, or Firm*—Fish & Richardson P.C.

(57) ABSTRACT

A differential-input flash analog-to-digital converter (ADC) uses digital common-mode rejection wherein the output sequences from two non-differential flash ADCs are differenced and further processed in the digital domain. Each of a pair of non-differential ADCs converts an associated one of two received voltage signals into a digital signal having N quantization levels, a subtractor digitally subtracts the two digital signals to produce a difference signal having 2N quantization levels, and a re-quantizer re-quantizes the difference signal to produce an N-level quantized representation of the difference signal. The flash ADC also effects comparator offset dynamic element matching to reduce the deleterious effects of ADC error resulting from the inevitable non-zero offset voltages of the comparators from which the each flash ADC is constructed.

19 Claims, 4 Drawing Sheets

U.S. PATENT DOCUMENTS

| | | | |
|---|---|---|---|
| 4,972,436 A | 11/1990 | Halim et al. | |
| 4,978,959 A | 12/1990 | Chong et al. | |
| 5,027,119 A | * 6/1991 | Toyomaki | 341/144 |
| 5,138,317 A | 8/1992 | Story | |
| 5,148,167 A | 9/1992 | Ribner | |
| 5,148,810 A | 9/1992 | Maslak et al. | |
| 5,192,876 A | 3/1993 | Karube | |
| 5,196,852 A | 3/1993 | Galton | |
| 5,206,648 A | 4/1993 | Yukawa | |
| 5,221,926 A | 6/1993 | Jackson | |
| 5,245,344 A | 9/1993 | Sooch | |
| 5,258,758 A | 11/1993 | Sooch | |
| 5,266,908 A | 11/1993 | Koulopoulos et al. | |
| 5,272,479 A | 12/1993 | Silver | |
| 5,274,375 A | 12/1993 | Thompson | |
| 5,283,578 A | 2/1994 | Ribner et al. | |
| 5,319,370 A | 6/1994 | Signore et al. | |
| 5,349,353 A | 9/1994 | Zrilic | |
| 5,351,050 A | 9/1994 | Thompson et al. | |
| 5,369,404 A | 11/1994 | Galton | |
| 5,392,042 A | 2/1995 | Pellon | |
| 5,404,142 A | 4/1995 | Adams et al. | |
| 5,410,498 A | 4/1995 | Staver | |
| 5,436,858 A | 7/1995 | Staver | |
| 5,440,305 A | 8/1995 | Signore et al. | |
| 5,446,455 A | 8/1995 | Brooks | |
| 5,500,645 A | 3/1996 | Ribner et al. | |
| 5,528,239 A | 6/1996 | Swanson et al. | |
| 5,533,029 A | 7/1996 | Gardner | |
| 5,541,864 A | 7/1996 | Van Bavel et al. | |
| 5,542,054 A | 7/1996 | Batten, Jr. | |
| 5,544,081 A | 8/1996 | Yukawa | |
| 5,544,222 A | 8/1996 | Robinson | |
| 5,550,544 A | 8/1996 | Sakiyama et al. | |
| 5,561,660 A | 10/1996 | Kotowski et al. | |
| 5,565,867 A | 10/1996 | Tiemann | |
| 5,574,455 A | 11/1996 | Hori et al. | |
| 5,583,501 A | 12/1996 | Henrion et al. | |
| 5,585,727 A | 12/1996 | Fanini et al. | |
| 5,594,439 A | 1/1997 | Swanson | |
| 5,594,612 A | 1/1997 | Henrion | |
| 5,600,318 A | 2/1997 | Li | |
| 5,608,400 A | 3/1997 | Pellon | |
| 5,621,675 A | 4/1997 | Linz et al. | |
| 5,627,499 A | 5/1997 | Gardner | |
| 5,627,536 A | 5/1997 | Ramirez | |
| 5,646,621 A | 7/1997 | Cabler et al. | |
| 5,648,779 A | 7/1997 | Cabler | |
| 5,652,512 A | 7/1997 | Feintuch et al. | |
| 5,652,585 A | * 7/1997 | Leung et al. | 341/155 |
| 5,654,711 A | 8/1997 | Fujimori | |
| 5,661,482 A | 8/1997 | Shou et al. | |
| 5,675,713 A | 10/1997 | Batten, Jr. | |
| 5,677,618 A | 10/1997 | Fiez et al. | |
| 5,677,845 A | 10/1997 | Staver et al. | |
| 5,682,161 A | 10/1997 | Ribner et al. | |
| 5,684,482 A | 11/1997 | Galton | |
| 5,696,575 A | 12/1997 | Kohnen et al. | |
| 5,703,589 A | 12/1997 | Kalthoff et al. | |
| 5,719,572 A | 2/1998 | Gong | |
| 5,721,547 A | 2/1998 | Longo | |
| 5,726,607 A | 3/1998 | Brede et al. | |
| 5,726,652 A | 3/1998 | Giuroiu | |
| 5,732,004 A | 3/1998 | Brown | |
| 5,745,060 A | 4/1998 | McCartney et al. | |
| 5,751,615 A | 5/1998 | Brown | |
| 5,754,601 A | 5/1998 | Horng et al. | |
| 5,768,478 A | 6/1998 | Batten, Jr. | |
| 5,781,044 A | 7/1998 | Riley et al. | |
| 5,781,137 A | 7/1998 | Knudsen | |
| 5,781,138 A | 7/1998 | Knudsen | |
| 5,790,063 A | 8/1998 | Koifman et al. | |
| 5,790,064 A | 8/1998 | Fujimori | |
| 5,801,652 A | 9/1998 | Gong | |
| 5,818,370 A | 10/1998 | Sooch et al. | |
| 5,818,374 A | 10/1998 | Tan | |
| 5,818,375 A | 10/1998 | Yoshizawa | |
| 5,818,377 A | 10/1998 | Wieser | |
| 5,835,038 A | 11/1998 | Nakao et al. | |
| 5,841,310 A | 11/1998 | Kalthoff et al. | |
| 5,854,599 A | 12/1998 | Heo et al. | |
| 5,863,894 A | 1/1999 | Vlasuk et al. | |
| 5,864,009 A | 1/1999 | Vlasuk et al. | |
| 5,866,542 A | 2/1999 | Vlasuk et al. | |
| 5,866,543 A | 2/1999 | Vlasuk et al. | |
| 5,866,969 A | 2/1999 | Shimada et al. | |
| 5,867,116 A | * 2/1999 | Nakamura et al. | 341/155 |
| 5,870,046 A | 2/1999 | Scott et al. | |
| 5,872,098 A | 2/1999 | Vlasuk et al. | |
| 5,877,716 A | 3/1999 | Tagami | |
| 5,877,718 A | * 3/1999 | Andoh et al. | 341/155 |
| 5,903,350 A | 5/1999 | Bush et al. | |
| 5,936,562 A | 8/1999 | Brooks et al. | |
| 5,943,000 A | 8/1999 | Nessi et al. | |
| 5,945,275 A | 8/1999 | Vlasuk et al. | |
| 5,955,294 A | 9/1999 | Vlasuk et al. | |

OTHER PUBLICATIONS

P. Carbone, I. Galton, "Conversion error in D/A employing dynamic element matching," Proc. of the IEEE International Symposium on Circuits and Systems, vol. 2, pp. 13–16, May, 1994.

Chen, et al.; A High Resolution Multibit Sigma–Delta Modulator with Individual Level Averaging; IEEE J. Solid–State Circuits, vol. SC–30, No. 4, pp. 453–460; Apr. 1995.

Fogleman, et al.; A Dynamic Element Matching Technique for Reduced–distortion Multibit Quantization in Delta–Sigma ADCS; Proc. IEEE International Symposium on Circuits and Systems, Jun. 1999.

Fogleman, et al.; A 3.3V Single–Poly CMOS Audio ADC Delta–Signma Modulator with 98dB Peak SINAD; IEEE Journal of Solid State Circuits, vol. 35, No. 3; Mar. 2000.

Fogleman, et al.; A 3.3V Single–Poly CMOS Audio ADC Delta–Signma Modulator with 98dB Peak SINAD and 105–dB Peak SFDR; IEEE Journal of Solid State Circuits, vol. 35, No. 3; Mar. 2000.

I. Galton, "An efficient three point arc algorithm," IEEE Computer Graphics and Applications, vol. 9, No. 6, pp. 44–49, 1989.

I. Galton, "One–bit dithering in delta–sigma modulator–based D/N conversion," Proc. of the IEEE International Symposium on Circuits and Systems, 1993.

I. Galton, G. Zimmerman, "Combined RF phase extraction and digitization," Proc. of the IEEE International Symposium on Circuits and Systems, 1993.

I. Galton, "Granular quantization noise in the first–order delta–sigma modulator," IEEE Transactions on Information Theory, vol. 39, No. 6, pp. 1944–1956, Nov. 1993.

I. Galton, "Higher–order delta–sigma frequency–to–digital conversion," Proc. of the IEEE International Symposium on Circuits and Systems, vol. 5, pp. 441–444, May, 1994.

I. Galton, "A practical second–order delta–sigma frequency–to–digital converter," Proc. of the IEEE International Symposium on Circuits and Systems, vol. 1, pp. 5–8, May, 1995.

I. Galton, "Analog–input digital phase–locked loops for precise frequency and phase demodulation," IEEE Transactions on Circuits and Systems II: Analog and Digital Processing, vol. 42, No. 10, pp. 621–630, Nov., 1995.

I. Galton and P. Carbone, "A rigorous analysis of D/A conversion with dynamic element matching," IEEE Transactions on Circuits and Systems II: Analog and Digital Signal Processing, vol. 42, No. 12, pp 763–772, Dec., 1995.

I. Galton and H.T. Jensen, "Delta–sigma modulator based A/D conversion without oversampling," IEEE Transactions on Circuits and Systems II: Analog to Digital Signal Processing, vol. 42, No. 12, pp. 773–784, Dec., 1995.

I. Galton, H.T. Jensen, J.J. Rosenberg, D.A. Towne, "Clock distribution using coupled oscillators," Proc. of the IEEE International Symposium on Circuits and Systems, vol. 3, pp. 217–220, May, 1996.

I. Galton, "Noise–shaping D/A converters for delta–sigma modulation," Proc. of the 1998 International Symposium on Circuits and Systems, vol. 1, May, 1996.

I. Galton and H.T. Jensen, "Oversampling parallel delta–sigma modulator A/D conversion," IEEE Transactions on Circuits and Systems II: Analog and Digital Signal Processing, vol. 43, No. 12, pp. 801–810, Dec. 1996.

Galton; Spectral Shaping of Circuit Errors in Digital–to–Analog Converters; IEEE Transactions on Circuits and Systems, vol. 44, No. 10; pp 8080–817; Oct. 1997.

I. Galton, W. Huff, P. Carbone, E. Siragusa, "A delta–sigma PLL for 14b 50kSample/s frequency–to–digital conversion of a 10 MHz FM signal," IEEE International Solid–State Circuits Conference, vol. 41, pp. 366–367, Feb., 1998.

Galton et al.; A Delta–Sigma PLL for 14–b, 50 kSample/s Frequency–to–Digital Conversion of a 10 MHz FM Signal; IEEE Journal of Solid–State Circuits, vol. 33, No. 12, pp. 2042–2053; Dec. 1998.

W. Huff, I. Galton, "Nonuniform–to–uniform decimation for delta–sigma frequency–to–digital conversion," Proc. IEEE Symposium on Circuits and Systems, vol. 1, pp. 365–368, May, 1998.

H.T. Jensen, I. Galton, "A robust parallel delta–sigma A/D converter architecture," Proc. of the IEEE International Symposium on Circuits and Systems, vol. 2, pp. 1340–1343, May, 1995.

H.T. Jensen, I. Galton, "A hardware–efficient DAC for direct digital synthesis," Proc. of the IEEE International Symposium on Circuits and Systems, vol. 4, pp. 97–100, May, 1996.

H.T. Jensen, I. Galton, "Yield estimation of a first–order noise–shaping D/A converter," Proc. of the IEEE International Symposium on Circuits and Systems, vol. 1, pp. 441–444, Jun., 1997.

H.T. Jensen, I. Galton, "A performance analysis of the partial randomization dynamic element matching DAC architecture," Proc. of the IEEE International Symposium on Circuits and Systems, vol. 1, pp. 9–12, Jun., 1997.

H.T. Jensen and I. Galton, "A low–complexity dynamic element matching DAC for direct digital synthesis," *IEEE Transactions on Circuits and Systems II: Analog and Digital Signal Processing*, vol. 45, No. 1, pp. 13–27, Jan., 1998.

H.T. Jensen, I. Galton, "A reduced–complexity mismatch–shaping DAC for delta–sigma data converters," Proc. IEEE Symposium on Circuits and Systems, vol. 1, pp. 504–507, May, 1998.

Jensen et al.; An Analysis of the Partial Randomization Dynamic Element Matching Technique; IEEE Transaction on Circuits and Systems, vol. 45, No. 12, pp. 1538–1549; Dec. 1998.

E. King, F. Aram, T. Fiez, I. Galton, "Parallel delta–sigma A/D conversion," Proc. of the IEEE Custom Integrated Circuits Conference, pp. 503–506, May, 1994.

E.T. King, A. Eshraghi, I. Galton, T.S. Fiez, "A Nyquist–rate delta–sigma A/D converter," IEEE Journal of Solid State Circuits, vol. 33, No. 1, pp. 45–52, Jan., 1998.

Kwan et al.; A Stereo Multibit $\Sigma\Delta$ DAC with Asynchronous Master–Clock Interface; IEEE ISSCC Dig. Of Tech. Papers, vol. 39, pp. 226–227, Dec., 1996.

Leung, et al.; Multibit $\Sigma$—$\Delta$ A/D Converter Incorporating A Novel Class of Dynamic Element Matching Techniques; Jun. 1988.

Lewis et al; A Pipeline 5–Msample /s 9–bit Analog–to–Digital Converter; IEEE Journal of Solid–State Circuits, vol. SC–22, No. 6; pp. 954–961; Dec. 1987.

Schreier et al; Noise–shaped multi–bit D/A converter employing unit elements; Electronics Letters, vol. 31, No 20, pp. 1712–1713, Sep. 28, 1995.

* cited by examiner

ANALOG-TO-DIGITAL CONVERTERS WITH COMMON-MODE REJECTION DYNAMIC ELEMENT MATCHING, INCLUDING AS USED IN DELTA-SIGMA MODULATORS

REFERENCE TO A RELATED PATENT APPLICATION

The present application is related to, and claims the benefit of priority of, U.S. provisional patent application serial No. 60/124,245 filed Mar. 12, 1999, for DYNAMIC-ELEMENT-MATCHING ANALOG-TO-DIGITAL CONVERTER (ADC) WITH COMMON MODE REJECTION to the selfsame inventors as the present application.

BACKGROUND OF THE INVENTION

1. Field of the Invention

The present invention generally concerns improvements to flash Analog-to-Digital Converters (ADCs), such as may be used within delta-sigma ($\Delta\Sigma$) modulators.

The present invention particularly concerns differential input flash ADCs appropriate for integrated circuit implementation.

2. Description of the Prior Art 2.1 General Background

For mixed-signal ICs with high digital circuit content, single-poly CMOS integrated circuit processes optimized for digital circuits can presently (circa 2000) provide the lowest overall implementation cost. For example, it is preferable to avoid the expense of extra process steps beyond those required for digital circuitry—such as double-poly capacitors, thick-oxide transistors for 5 V operation, or other analog process enhancements—when analog circuits such as data converters make up only a small portion of the total die area. This is often true even if the lack of analog enhancements significantly increases the area of the analog circuitry.

However, the performance that can be achieved by data converters in a digital-optimized, single-poly CMOS process may limit the extent to which this advantage can be exploited. High-resolution data converters require linear capacitors and low-noise, low-distortion amplifier circuits to implement fundamental building blocks such as sample-and-holds, integrators, and comparators. Though the specific circuits and performance specifications are determined by the data converter's architecture, the lack of linear capacitors with low parasitic capacitance, and process-related supply voltage restrictions, arising in modern (circa 2000), digital-optimized, single-poly CMOS processes generally present key challenges in realizing high-performance data converters.

In a CMOS process without double-poly capacitors or other thin-oxide, linear capacitor structures, either metal interconnect layers or MOS structures must be used to implement linear capacitors. MOS capacitor structures (MOSCAPs) require special biasing to keep them in an accumulated or depleted operating region and to mitigate their inherent non-linearity. Metal interconnect (metal-metal) capacitors are inherently linear, but for a given value of capacitance, a metal-metal capacitor can require as much as 30 times the area of a double-poly capacitor. Moreover, the bottom plate capacitance of a metal-metal capacitor is comparable to the inter-plate capacitance, while the double-poly capacitor's parasitic capacitance is typically less than 50% of the inter-plate capacitance.

Process-related limitations on supply voltages to 3.3 V or less restrict signal swings in amplifiers and through analog switches. In switched-capacitor circuits, this necessitates increased sampling capacitances to achieve the target signal to thermal noise ratio. In switched-capacitor integrators, large feedback capacitances may be required to scale the output down to fit within the amplifier's output swing. Thus, the reduced headroom and increased loading complicate the task of realizing fast settling, low-distortion switched-capacitor circuits.

It might be possible to mitigate these problems through critical refinement of the analog circuits, but a strategy that would use digital processing to minimize the performance requirements of the analog circuits would seemingly make better use of the strengths of a digital-optimized CMOS process.

Multibit $\Delta\Sigma$ modulation-using mismatch-shaping DACs exemplifies this approach. By reducing the quantization noise power to be shaped out of band relative to two-level quantization, a multibit $\Delta\Sigma$ can achieve the same SINAD with a lower order $\Delta\Sigma$ modulator and a lower over-sampling ratio than can a single-bit design. The reduction in $\Delta\Sigma$ modulator order implies that fewer switched-capacitor stages are required, and the reduced over-sampling ratio relaxes the bandwidth and slew rate requirements on the integrators. The mismatch-shaping DAC in the feedback path causes static DAC mismatch errors to fall predominantly outside the signal band and significantly relaxes the matching requirements on the DAC's analog components.

See B. H. Leung, S. Sutarja, Multi-bit sigma-delta A/D converter incorporating a novel class of dynamic element matching techniques, *IEEE Trans. on Circuits and Systems-II: Analog and Digital Signal Processing*, vol. 39, no. 1, pp. 35–51, Jan. 1992; F. Chen, B. H. Leung, A high resolution multibit sigma-delta modulator with individual level averaging, *IEEE J. Solid-State Circuits*, vol. SC-30, no. 4, pp. 453–460, April 1995; M. J. Story, Digital to analogue converter adapted to select input sources based on a preselected algorithm once per cycle of a sampling-signal, U.S. Pat. No. 5,138,317, Aug. 11, 1992; H. Spence Jackson, Circuit and Method for Canceling Nonlinearity Error Associated with Component Value Mismatches in a Data Converter, U.S. Pat. No. 5,221,926, 11 Oct. 14, 1999 11 Jun. 22, 1993; R. T. Baird, T. S. Fiez, Improved $\Delta\Sigma$ DAC linearity using data weighted averaging, Proceedings of the *IEEE International Symposium on Circuits and Systems*, May, 1995; R. T. Baird, T. S. Fiez, Linearity enhancement of multi-bit $\Delta\Sigma$ A/D and D/A converters using data weighted averaging, *IEEE Trans. on Circuits and Systems II: Analog and Digital Signal Processing*, vol. 42, no. 12, pp. 753–762, Dec. 1995; R. Schreier, B. Zhang, Noise-shaped multi-bit D/A converter employing unit elements, *Electronics Letters*, vol. 31, no. 20, pp. 1712–1713, Sept. 28, 1995; R. W. Adams, T. W. Kwan, Data-directed Scrambler for Multi-bit Noise Shaping D/A Converters, U.S. Pat. No. 5,404,142, Apr. 4, 1995; T. W. Kwan, R. W. Adams, R. Libert, A stereo multi-bit S? D/A with asynchronous master-clock interface, *IEEE ISSCC Dig. of Tech. Papers*, vol. 39, pp. 226–227, Feb. 1996; T. W. Kwan, R. W. Adams, R. Libert, A stereo multibit Sigma Delta DAC with asynchronous master-clock interface, *IEEE Journal of Solid-State Circuits*, vol. 31, no. 12, pp. 1881–1887, Dec. 1996; I. Galton, Spectral shaping of circuit errors in digital-to-analog converters, *IEEE Transactions on Circuits and Systems II: Analog and Digital Signal Processing*, vol. 44, no. 10, pp. 808–817, Oct. 1997; and I. Galton, Spectral Shaping of Circuit Errors in Digital-to-Analog Converters, U.S. Pat. No. 5,684,482, Nov. 4, 1997.

The multibit approach eases the design requirements on the switched-capacitor circuits, but it also introduces several new design challenges. The transfer function from the first integrator input to the ΔΣ modulator output provides no noise shaping. Therefore, the first stage feedback DAC must have the same signal-band precision as the overall data converter. Furthermore, the reduced ΔΣ modulator order and over-sampling ratio imply that the noise transfer function provides less attenuation of circuit noise and distortion in the flash ADC quantizer relative to single-bit designs. Thus the flash ADC must provide sufficient common mode noise rejection and SFDR performance to meet the overall data converter's performance targets.

SUMMARY OF THE INVENTION

The present invention contemplates improvements to conventional so-called flash analog-to-digital converters (ADCs). Flash ADCS are used in a variety of applications, one example of which is as internal components within so-called delta-sigma (ΔΣ) modulator circuits for performing very precise analog-to-digital conversion.

The first improvement contemplated is to realize a differential-input flash ADC using digital common-mode rejection wherein the output sequences from two non-differential flash ADCs are (i) differenced, and (ii) further processed, in the digital domain.

The second improvement contemplated, which is realizable separately and independently of the first improvement, is to effect comparator offset dynamic element matching as a means of reducing the deleterious effects of ADC error resulting from the inevitable non-zero offset voltages of the comparators from which a flash ADC is constructed.

Both improvements are directed at improving the analog-to-digital conversion performance of flash ADCs, especially when used as sub-components within larger circuits—such as a delta-sigma (ΔΣ) modulator ADCs—that are implemented in a technology optimized for digital circuits, particularly including single-poly CMOS technology.

1. Improvement 1—An ADC with Digital Common-mode Rejection

In integrated circuits, differential signals are often used where information is represented as the difference between two voltages. To perform analog-to-digital (A/D) conversion on such signals, an analog-to-digital converter (ADC) is required to perform A/D conversion of the difference between its two input terminals. The existing methods of implementing such an ADC, referred to as a "differential ADC", are problematic for various reasons when integrated circuit technology optimized for digital circuits is employed.

In accordance with the present invention, these problems are circumvented by (1) use of a pair of non-differential ADCs to A/D convert the two input voltages separately, followed by (2) a digital differencing operation followed by (3) a re-quantization function. The (2) differencing operation generates the desired difference signal, but has the drawback that the signal has twice as many quantization levels as would normally be required to represent the information. The (3) re-quantization reduces the number of levels by two in such a way that the information content of the signal is not significantly corrupted.

Alternatively, in a variant of the invention, the non-differential ADCs (1) convert the two input voltages into quantized signals of approximately half the desired number of quantization levels, and when these signals are subsequently subjected to (2) a digital differencing operation then the desired number of quantization levels is restored. In this variant, a requantization function (3) is not required.

2. Improvement 2—A Flash ADC with Comparator Offset Dynamic Element Matching Flash ADCs are implemented with voltage comparators that compare the input voltage to a set of nominally evenly spaced reference voltages. Ideally, a voltage comparator generates a digital "high" output voltage when the voltage difference between its two input terminals is greater than zero, and a digital "low" output voltage if the difference is less than zero. Thus, the "comparison threshold" between voltages is ideally zero. Unfortunately, mismatches in the fabrication process cause real-world voltage comparators have comparison thresholds that differ from zero by a so-called "offset voltage", and this phenomenon can cause significant error in flash ADCs.

The second improvement in accordance with the present invention deals with this problem by pseudo-randomly modulating the comparison threshold in a positive and negative sense such that the error from the offset voltages as seen at the output of the flash ADC is scrambled.

This pseudo-random offset modulation is realized by (i) dynamically interchanging or not interchanging the two input voltages applied to each comparator, and simultaneously (ii) inverting or not inverting the comparator output, depending upon whether a pseudo-random bit sequence, generated, for example, by a linear feedback shift register pseudo-random sequence generator, is either high or low. The comparator input voltage interchanging operation is implemented via analog switches such as transmission gates, and the comparator output inversion operation can be implemented using digital logic gates or, if differential comparator outputs are available, via analog or digital switches such as transmission gates.

The same pseudo-random bit sequence may be used to control all of the above-mentioned interchanging and inverting operations within the flash ADC. Because the interchanging of the two input signals to each comparator is matched by the inversion of the comparator output signal, the polarity of the comparator output signal is unaffected, except when the two comparator input signals differ by less than the offset voltage of the comparator. In this fashion, the effective polarity of the offset voltages of the all the comparators in the flash ADC are modulated in a pseudo-random fashion with the benefit that a significant portion of the harmonic distortion that would otherwise be introduced by the presence of fixed offset voltages is instead converted to white noise.

This second improvement of the present invention—an improvement to the use of comparators within ADCs—is independent of the first improvement of the present invention—an improvement to the design of differential-input flash ADCs. However, both improvements are related in that they are beneficial to the design of flash ADCs in integrated circuit processes that are optimized for digital circuitry. Since increasing integration of analog and digital functionality within a single integrated circuit is desired for applications such as wireless telephony, the improvements of the present invention constitute steps toward implementing, and using, ADCs with high precision in a digital technology environment.

These and other aspects and attributes of the present invention will become increasingly clear upon reference to the following drawings and accompanying specification.

BRIEF DESCRIPTION OF THE DRAWINGS

Referring particularly to the drawings for the purpose of illustration only and not to limit the scope of the invention in any way, these illustrations follow.

DESCRIPTION OF THE PREFERRED EMBODIMENT

Figure 1:
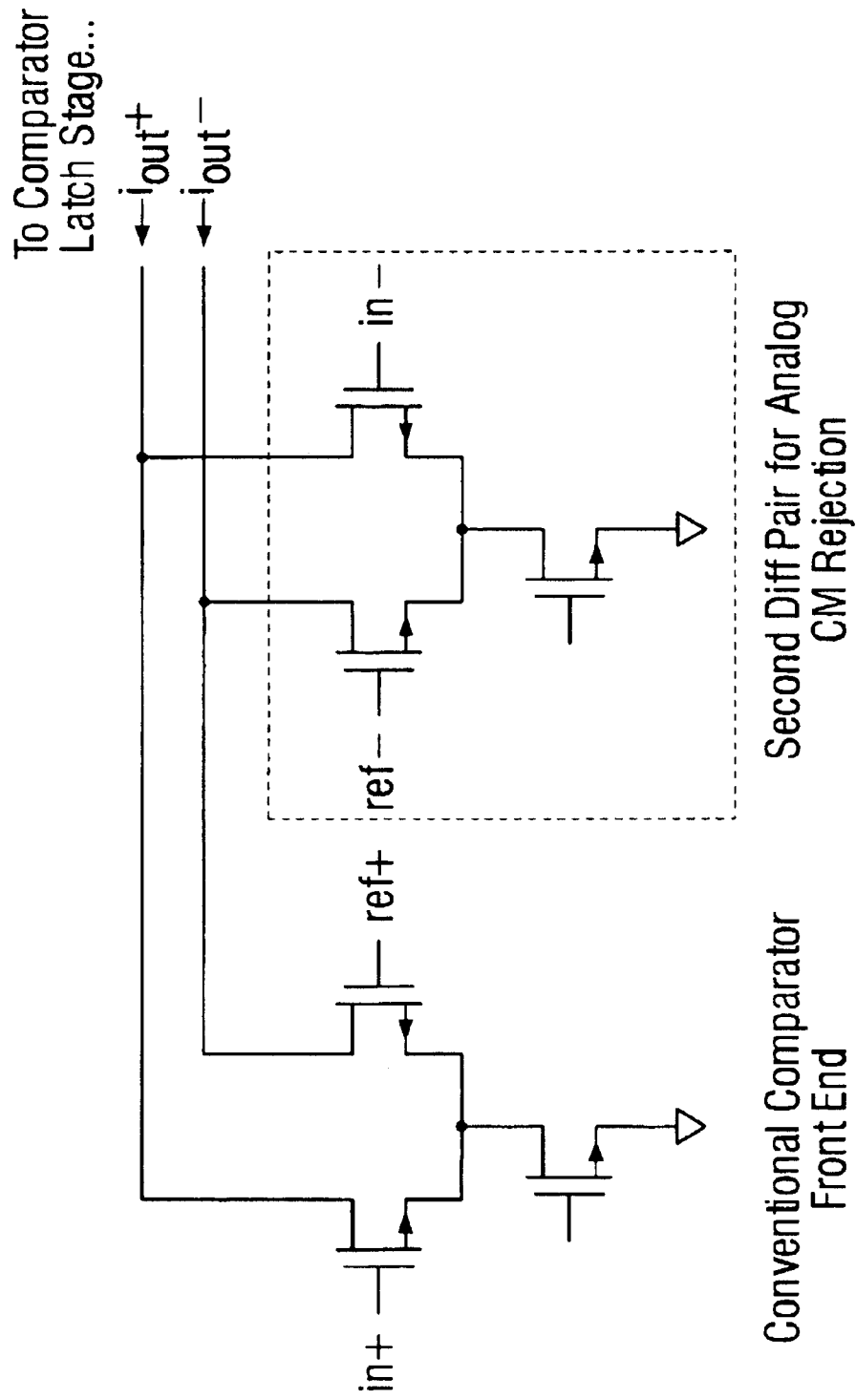
FIG. 1 is a schematic showing a less preferred circuit for performing a less preferred analog common mode rejection technique in accordance with the present invention for implementing a differential input flash analog-to-digital converter (ADC)

Although specific embodiments of the invention will now be described with reference to the drawings, it should be understood that such embodiments are by way of example only and are merely illustrative of but a small number of the many possible specific embodiments to which the principles of the invention may be applied. Various changes and modifications obvious to one skilled in the art to which the invention pertains are deemed to be within the spirit, scope and contemplation of the invention as further defined in the appended claims.

1. Delta-Sigma ($\Delta\Sigma$) Modulator Topology

A $\Delta\Sigma$ modulator to which the improvements of the present invention are particularly pertinent is based on a second-order $\Delta\Sigma$ modulator for A/D conversion with a pair of fully-differential switched capacitor integrators, a 33-level flash ADC and a 33-level mismatch-shaping DAC. See E. Fogleman, I. Galton, W. Huff, and H. T. Jensen, "A 3.3V single-poly CMOS audio ADC delta-sigma modulator with 98 dB peak SINAD and 105 dB peak SFDR," *IEEE Journal of Solid State Circuits*, vol. 35, no. 3, March, 2000. The improvements of the present invention are generally pertinent to differential flash analog-to-digital converters (ADCs), a well-known component.

2. A Differential Flash ADC

To preserve the common mode noise rejection benefits of fully-differential switched-capacitor circuitry, a differential flash ADC must quantize the second integrator's differential output with respect to a set of differential reference levels. The second-order noise transfer function typically provides only 52 dB of attenuation at the passband edge, and thus a flash ADC's common mode rejection is a critical factor in meeting the SDFR target of a $\Delta\Sigma$ modulator, which SDFR target may commonly be as high as 105 dB.

A common approach to implementing a differential input flash ADC in a $\Delta\Sigma$ modulator uses a pair of switched capacitors to sample and compare the differential signal and reference levels on alternate clock phases. See S. H. Lewis, P. R. Gray, A pipelined 5-Megasample/s 9-bit analog-to-digital converter, *IEEE Journal of Solid-State Circuits*, vol. SC-22, no. 6, pp. 954–961, Dec. 1987.

In a particular $\Delta\Sigma$ modulator implemented by the inventors (see E. Fogleman, et al., op cit.) sampling capacitors larger than 100 fF would have been required to reduce sufficiently the error caused by charge-sharing with each comparator's parasitic input capacitance. If implemented in this way, a 33-level flash ADC would have required an array of 64 capacitors which would have consumed approximately 5% of the die area of an entire chip on which the $\Delta\Sigma$ modulator was implemented. Moreover, this approach would have required a low output impedance reference ladder capable of driving switched-capacitor loads, and would have contributed significant loading of the second integrator. Buffering the reference ladder with source-followers would have presented a circuit design challenge given the limited headroom, and using a low resistance ladder would have significantly increased the power dissipation. To avoid these problems, an approach that eliminates the need for switched-capacitors is desirable.

In principle, an analog approach that could avoid the need for capacitors would involve the use of a comparator with two differential inputs to cancel the common mode component. Such a scheme is shown in FIG. 1. Therein a comparator converts the signals ($in_+$-$ref_+$) and ($in_-$-$ref_-$) to currents using two differential pairs, subtracts the differential currents to cancel the common mode component and sends the resulting signal to a conventional latching stage. While this technique provides small-signal common mode rejection, it can be verified that the common mode signal modulates the differential transconductance. This leads to signal dependent offsets and creates a mechanism for inter-modulation of the differential and common mode signals. Though this problem could possibly be mitigated by careful design, the approach was not used because of the aggressive $\Delta\Sigma$ modulator SFDR target. Accordingly, the circuit, and analog approach, shown in FIG. 1 is less preferred. The most preferred approach, and circuit, of the present invention is digital common mode rejection, as explained in the following sections.

3. Digital Common Mode Rejection Within a Flash ADC, In Accordance with the Present Invention We have now reached a point in the discussion where application of the first improvement of the present invention can be observed in context of an actual circuit.

To provide both large-and small-signal common mode rejection without switched capacitors, the $\Delta\Sigma$ modulator using the first improvement in accordance with the present invention incorporates digital common mode rejection (DCMR) implemented using a pair of single-ended, 33-level flash ADCs and digital processing to cancel the common mode noise component. See E. Fogleman, I. Galton, H. Jensen, An Area-Efficient Differential Input ADC with Digital Common Mode Rejection, *Proc. IEEE International Symposium on Circuits and Systems*, June 1999.

Figure 2:
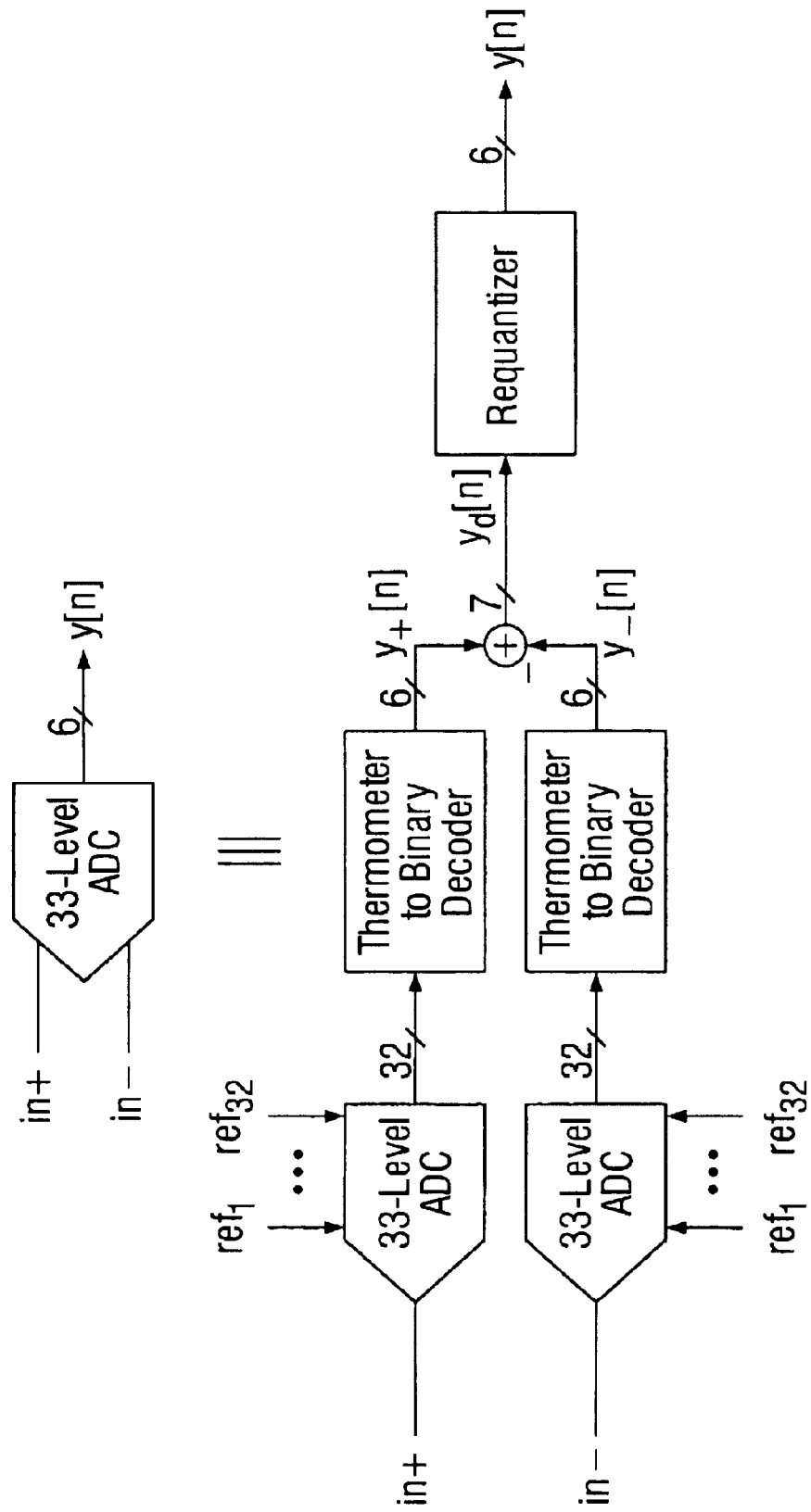
FIG. 2 is a schematic diagram showing a high-level view of a most preferred 33-level digital common mode rejection (DCMR) flash analog-to-digital converter (ADC) in accordance with the present invention.

As shown in FIG. 2, the single-ended flash ADC outputs, $y_+[n]$ and $y_-[n]$, are subtracted to cancel the common mode component yielding a 65-level difference signal, $Y_d[n]$. The difference is re-quantized to a 33-level signal, $y[n]$, to avoid the need for a 65-level DAC.

In the absence of common mode noise, the DCMR flash ADC is equivalent to a conventional 33-level flash ADC. In this case, the outputs $y_+[n]$ and $y_-[n]$ are complementary signals and the difference signal, $y_d[n]$, takes on only even values. In this case, dropping the LSB of $Y_d[n]$ will yield the correct 33-level output.

Figure 3:
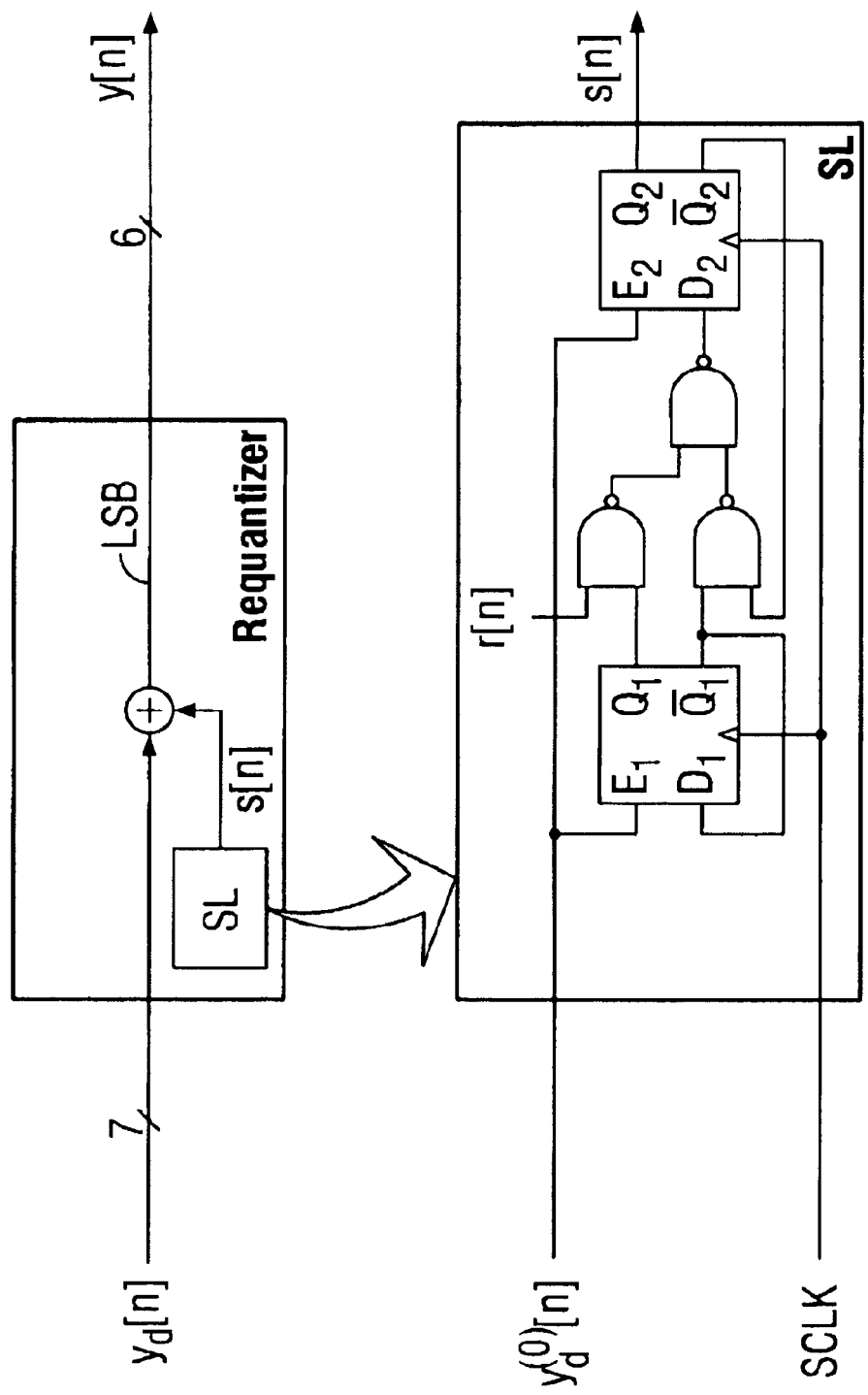
FIG. 3 is a schematic diagram showing a preferred implementation of a re-quantizer, previously seen in FIG. 2, in accordance with the present invention.

When common mode noise is present at the input of the DCMR flash ADC, it can be shown that the digital subtraction cancels the common mode noise without generating spurious tones and that the quantization noise power of $Y_d[n]$ is between that of a 33-level quantizer and that of a 65-level quantizer. However, y_+[n] and y_-[n] are not complementary in this case, so $y_d[n]$ is a 65-level signal that takes on both even and odd values. Rather than implementing a 65-level mismatch-shaping DAC and incurring the additional hardware overhead, a noise-shaping re-quantizer (shown in FIG. 3) was used to re-quantize $Y_d[n]$ to a 33-level signal. By rounding odd values of $y_d[n]$ up or down in a first-order, noise-shaped fashion and eliminating the LSB, the circuit shown in FIG. 3, including a preferred linear feedback shift register pseudo-random sequence generator SL, causes the re-quantization error to be spur-free and to fall predominantly outside the signal band.

Relative to a single differential input ADC, the DCMR architecture of a $\Delta\Sigma$ modulator requires two single-ended, 33-level flash ADCs, a second bubble correction circuit and thermometer-to-binary encoder, a 6-bit subtractor, a 5-bit adder, a switching block of the type used in the mismatch-shaping DAC, and a single-bit random sequence. The digital circuitry consists of 240 combinational logic gates and two D-type flip-flops.

4. Flash ADC Errors Resulting from Comparator Offset Voltages

The reduced order and oversampling ratio of a $\Delta\Sigma$ modulator imply that the noise transfer function provides less attenuation of distortion introduced at the quantizer. Thus the non-linearity of the flash ADC components of a $\Delta\Sigma$ modulator can limit the SINAD and SFDR performance of the $\Delta\Sigma$ modulator. While both reference ladder resistor mismatches and comparator input offsets contribute to errors in the placement of the quantization levels, the comparator offsets are the dominant error source. Input offsets with $\delta v_{os} \approx 10$ mV are typical with the small geometry devices used in the comparators, and the resulting errors in the quantization levels are comparable to the 31.25 mV LSB of the flash ADC. Behavioral simulations confirmed that $\delta v_{os} = 10$ mV comparator offset errors could limit the SFDR performance of the $\Delta\Sigma$ modulator to below 105 dB. In contrast, 1% resistor mismatches in the reference ladder give rise to quantization level errors on the order of 1 mV. The dominant effect of the comparator offset errors becomes even more pronounced as the number of quantization levels is increased or as the signal swings are reduced. This occurs because the offset errors are fixed and do not scale with the reference voltages as do the errors due to resistor mismatch.

Switched-capacitor offset calibration was not used to overcome this problem because the large-area metal-metal capacitors required for each of the 64 comparators would significantly increase the size of the flash ADC.

5. Dynamic Element Matching Within a Flash ADC, In Accordance with the Present Invention We have now reached a point in the discussion where application of the second improvement of the present invention can be observed in context of this actual circuit. Before commencing, it should be noted that this second improvement, as hereinafter described, need not be implemented to realize the full advantage of the first improvement. Likewise, if the first-improvement digital common-mode rejection described immediately above in section 4 is not implemented, the second improvement of this section 5 is still of full force and effect.

The second improvement of the present invention is a randomization technique used to spectrally whiten errors caused by comparator input offsets. See E. Fogleman, I. Galton, H. Jensen, A Dynamic Element Matching Technique for Reduced-Distortion Multibit Quantization in Delta-Sigma ADCs, *Proc. IEEE International Symposium on Circuits and Systems*, June 1999. This approach is referred to as comparator offset dynamic element matching (DEM) because of its similarity to DEM techniques used in DACs.

Figure 4:
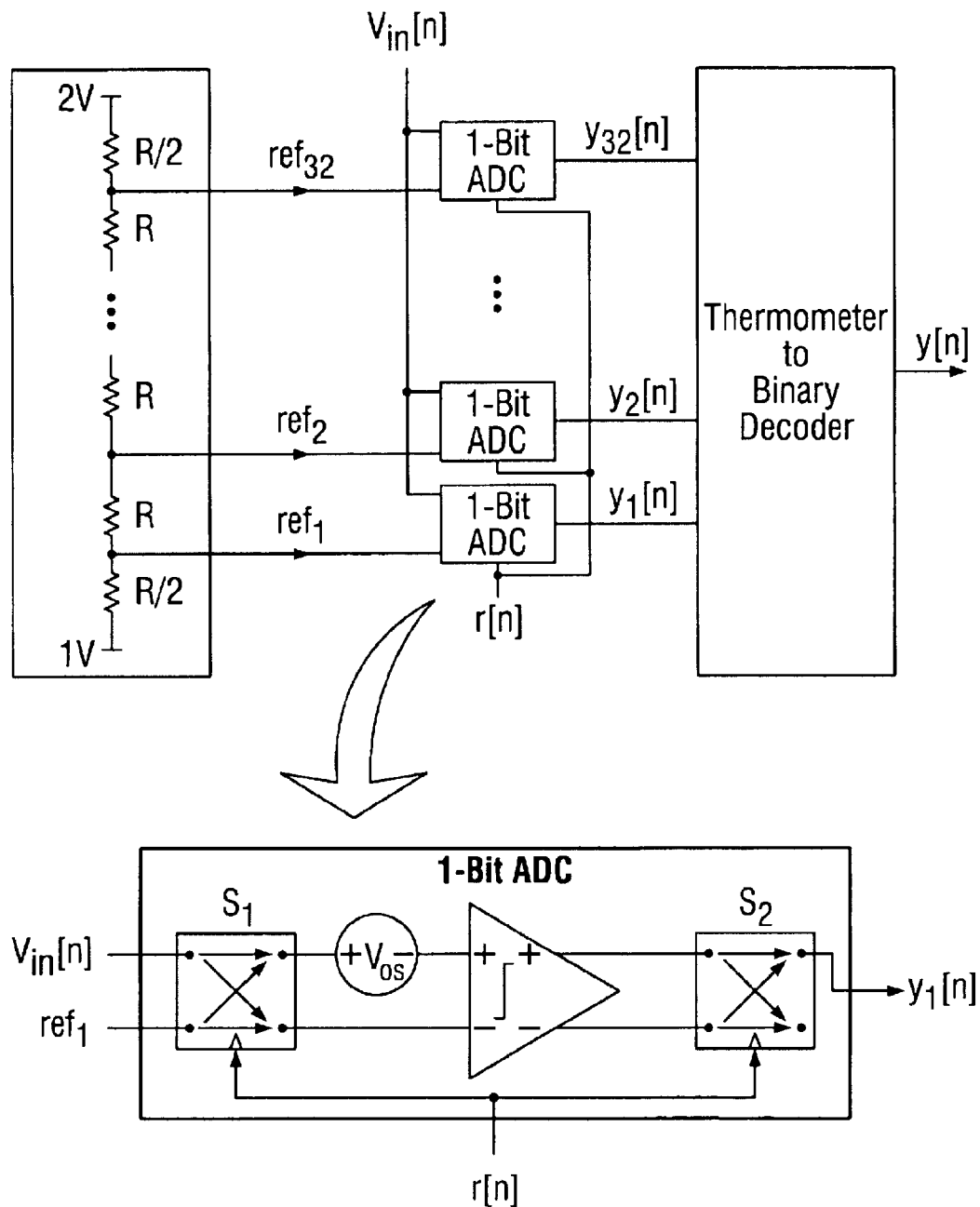
FIG. 4 is a schematic diagram showing a preferred implementation of comparator offset dynamic element matching (DEM) flash analog-to-digital converter (ADC) in accordance with the present invention.

FIG. 4 shows one of the single-ended flash ADCs with comparator offset DEM. The input and output of each comparator in the flash ADC are swapped according to a single-bit random sequence. The swapping is performed by transmission gates arranged such that the sign of each comparator offset is modulated by the random sequence but the polarity of the signal is unaffected. Only one threshold is active in the ADC per sample, so the random sequence only affects one comparator in the ADC per sample. Thus, a single random sequence is sufficient for the entire comparator bank.

It can be shown that comparator offset DEM causes the offset errors to appear as white noise and attenuated spurious components. See E. Fogleman, I. Galton, H. Jensen, A Dynamic Element Matching Technique for Reduced-Distortion Multibit Quantization in Delta-Sigma ADCs, *Proc. IEEE International Symposium on Circuits and Systems*, June 1999, op cit. Though it does not completely whiten spurious tones caused by offset errors, it was verified through simulations that comparator offset DEM along with the attenuation of the noise transfer function was sufficient to achieve better than 105 dB SFDR in a delta-sigma ($\Delta\Sigma$) modulator.

6. Recapitulation of the Inventions

Therefore, and by the explanation now rendered, in one of its several aspects the present will be understood to be embodied in an improved differential flash analog-to-digital converter (ADC) for quantizing a difference between two received voltage signals. The improved flash ADC includes (i) a pair of non-differential ADCs each converting an associated one of the two received voltage signals into a digital signal having N quantization levels, (ii) a subtractor digitally subtracting the two digital signals to produce a difference signal having 2N quantization levels, and (iii) a re-quantizer re-quantizing the difference signal to produce an N-level quantized representation of the difference signal.

Such an improved flash ADC may beneficially be used as a component of a delta sigma ($\Delta\Sigma$) modulator circuit.

In such an improved flash ADC a preferred (iii) re-quantizer is constructed from (i) a source of a sequence of logic state variables; and (ii) a circuit having one input sequence and generating one output sequence. In the (ii) circuit each value in the output sequence is generated from the corresponding value of the input sequence by dividing the input value by a factor of two if the input value is an even number then, else if the input value is an odd number then either adding a value of one and dividing the result by a factor of two if a corresponding value in the sequence of logic state variables is high, else if this corresponding value in the sequence of logic state variables is low then subtracting a value of one and dividing the result by a factor of two.

The sequence of logic state variables may in particular consist of a source of a sequence of pseudo-random bits, and this source of the sequence of pseudo-random bits may in particular consist of a linear feedback shift register pseudo-random sequence generator.

The source of the sequence of logic state variables preferably produces logic state variables having values corresponding to a time sample at which the difference signal input to the re-quantizer is an odd number, all such sequence values being ordered chronologically, the sequence of logic state variables being a sequence of one-bit values having a discrete-time power-spectral density that is spectrally shaped so as not to represent white noise.

In another of its aspects the present invention may be recognized to be embodied in a non-differential flash ADC having a plurality of comparators each with two input terminals and a means for dynamically connecting one of the input terminals to a reference voltage associated with the comparator and the other of the input terminals to an ADC input signal, or vice-versa, while simultaneously either inverting or else not inverting the output of the comparator depending upon the state of a pseudo-random bit sequence.

Alternatively, when embodied in a differential flash ADC, then such differential flash ADC will have a plurality of non-differential flash ADCs each of which includes a plurality of such comparators.

It will be recognized that the present invention can alternatively be expressed as an improved method of realizing flash analog-to-digital conversion in the quantizing of a differential voltage signal. Such an improved A/D conversion method consists essentially of (1) connecting a pair of single-ended n-level flash analog-to-digital converters (ADCs) so that one ADC receives one leg, and the other ADC the other leg, of the differential voltage signal, (2) independently converting with the pair of ADCs both legs of the differential voltage signal so as to produce two digital signals each having a number N of quantization levels, (3) digitally subtracting the two digital signals to produce a digital difference signal having 2N quantization levels; and (4) re-quantizing the digital difference signal to produce another digital difference signal having N quantization levels. By these operations common mode noise is canceled in the N-level quantized digital signal.

A variant of this improved differential flash analog-to-digital converter (ADC), and this method, is possible. The improved flash ADC can alternatively be based on only (1) a pair of single-ended non-differential (n/2)-level flash ADCs—each having a reference level offset by one-half of one quantization step, and each converting an associated one of the two received voltage signals into a digital signal having N/2 quantization levels—and (2) a subtractor digitally subtracting the two digital signals to produce a difference signal having N-1 quantization levels.

In yet another of its aspects the present invention will be recognized to be embodied in an improvement to the several two-terminal voltage comparators that are contained within a flash analog-to-digital converter (ADC). The ADC serves to quantize an analog signal. It does so when its several voltage comparators are organized to compare the analog signal to a set of spaced reference voltage signals. Each of,the several voltage comparator compares an associated analog signal at one of its terminals to an associated reference voltage signal at its other terminal to generate a digital signal dependent upon whether a difference between the associated analog and voltage signals is greater than or less than an offset signal.

In a voltage comparator so used, the improvement of the present invention consists of pseudo-randomly modulating the sense of the offset signals for the several comparators. This is realized by action of dynamically cross-switching, in a pseudo-random sequence between all the plurality of comparators, (1) the analog signal and the reference voltage signal input to each comparator simultaneously that (2) the polarity of the digital signal output from each comparator is also correspondingly switched.

By this cross-switching at each comparator of both (1) the input signals, and also (2) the output signal, the polarity of the comparator output signal is unaffected.

More importantly, by the pseudo-random cross switching of signals at all the comparators, comparator carrier voltage offset errors are modulated in pseudo-random sequence. This serves to whiten the effect of these offset errors in the quantized differential signal produced by the plurality of comparators, and by the ADC within which the comparators are contained.

The dynamic cross-switching at all comparators is preferably in response one single pseudo-random switching signal., The several differential comparators so improved may beneficially be used in a flash analog-to-digital converter (ADC) that is itself used in a mismatch-shaping multibit delta sigma ($\Delta\Sigma$) modulator.

In still yet another of its aspects, the present invention will be recognized to be embodied in an improved mismatch-shaping multibit delta sigma ($\Delta\Sigma$) modulator. The improved $\Delta\Sigma$ modulator includes (1) a pair of single-ended multi-level-quantizing flash ADCs independently quantizing both positive and negative portions of a differential signal, (2) a subtractor for digitally subtracting the positive and the negative signal portions to produce a difference signal (in which difference signal a common mode component is canceled), (3) a signal quantizer for producing a multi-level quantized representation of the differential signal (in which representation common mode noise is canceled), and (4) a digital-to-analog converter (DAC) for converting the multi-level quantized representation of the differential signal output to an analog signal fed back to the differential signal. By this organization the pair of single-ended multi-level-quantizing flash ADCs are connected for digital common mode rejection (DCMR).

Each of the pair of single-ended multi-level-quantizing flash ADCs preferably consists of (1) several voltage comparators, and (2) a circuit for dynamically cross-switching, in a pseudo-random sequence, all the plurality of comparators so that both a differential signal input to each comparator and a differential signal output by the same comparator are switched. This switching leaves an output signal at each comparator unaffected in polarity while the carrier voltage offset errors of all comparators ia modulated in pseudo-random sequence. The net effect is to whiten the offset errors appearing in the quantized differential signal that is produced by the several comparators, and by the ADC of which the comparators form a part. In ADC applications such as delta-sigma modulation this whitening generates a more desirable form of error.

7. Conclusion

The approach of the present invention is to cause the design burden to be shifted away from the analog circuitry at the expense of increased digital logic complexity. This approach tends to result in a beneficial tradeoff in integrated circuit fabrication processes optimized for digital logic.

In accordance with the preceding explanations, variations and adaptations of the ADC improvement circuits—whether expressed in a $\Delta\Sigma$ modulator or otherwise—in accordance with the present invention will suggest themselves to a practitioner of the digital signal processing and/or digital logic circuitry design arts.

In accordance with possible variations and adaptations of the present invention, the scope of the invention should be determined in accordance with the following claims, only, and not solely in accordance with that embodiment within which the invention has been taught.

What is claimed is:

1. An improved differential flash analog-to-digital converter (ADC) for quantizing a difference between two received voltage signals, the improved flash ADC comprising:
   a pair of non-differential ADCs each converting an associated one of the two received voltage signals into a digital signal having N quantization levels;
   a subtractor digitally subtracting the two digital signals to produce a difference signal having 2N quantization levels; and
   a re-quantizer re-quantizing the difference signal to produce an N-level quantized representation of the difference signal.

2. The improved flash ADC according to claim 1 used as a component of a delta sigma ($\Delta\Sigma$) modulator circuit.

3. An improved differential flash analog-to-digital converter (ADC) used as a component of a delta sigma ($\Delta\Sigma$) modulator circuit, for quantizing a difference between two received voltage signals, the improved flash ADC comprising:
   a pair of non-differential ADCs each converting an associated one of the two received voltage signals into a digital signal having N quantization levels;
   a subtractor digitally subtracting the two digital signals to produce a difference signal having 2N quantization levels; and
   a re-quantizer re-quantizing the difference signal to produce an N-level quantized representation of the difference signal, the re-quantizer comprising
      a source of a sequence of logic state variables; and
      a circuit having one input sequence and generating one output sequence wherein each value in the output sequence is generated from the corresponding value of the input sequence by either
         IF the input value is an even number THEN dividing the input value by a factor of two,
         ELSE IF the input value is an odd number
         AND IF a corresponding value in the sequence of logic state variables is high THEN adding a value of one and dividing the result by a factor of two,
         ELSE IF the corresponding value in the sequence of logic state variables is low THEN subtracting a value of one and dividing the result by a factor of two.

4. The improved ADC according to claim 3 wherein the source of the sequence of logic state variables comprises:
   a source of a sequence of pseudo-random bits.

5. The improved ADC according to claim 4 wherein the source of the sequence of pseudo-random bits comprises;
   a linear feedback shift register pseudo-random sequence generator.

6. The improved ADC according to claim 3 wherein the source of the sequence of logic state variables produces logic state variables having values corresponding to a time sample at which the difference signal input to the re-quantizer is an odd number, all such sequence values being ordered chronologically, the sequence of logic state variables being a sequence of one-bit values having a discrete-time power-spectral density that is spectrally shaped so as not to represent white noise.

7. A non-differential flash ADC comprising:
   a plurality of comparators each with two input terminals and a means for dynamically connecting one of the input terminals to a reference voltage associated with the comparator and the other of the input terminals to an ADC input signal, or vice-versa, while simultaneously either inverting or else not inverting the output of the comparator depending upon the state of a pseudo-random bit sequence.

8. A differential flash ADC comprising:
   a plurality of non-differential flash ADCs each including a plurality of comparators each with two input terminals and a means for dynamically connecting one of the input terminals to a reference voltage associated with the comparator and the other of the input terminals to an ADC input signal, or vice-versa, while simultaneously either inverting or else not inverting the output of the comparator depending upon the state of a pseudo-random bit sequence.

9. A method of realizing flash analog-to-digital conversion for quantizing a differential voltage signal, the improved A/D conversion method comprising:
   connecting a pair of single-ended n-level flash analog-to-digital converters (ADCs) so that one ADC receives one leg, and the other ADC the other leg, of the differential voltage signal;
   independently converting with the pair of ADCs both legs of the differential voltage signal so as to produce two digital signals each having a number N of quantization levels; and
   digitally subtracting the two digital signals to produce a digital difference signal having 2N quantization levels; and
   re-quantizing the digital difference signal to produce another digital difference signal having N quantization levels;
   wherein common mode noise is canceled in the N-level quantized digital signal.

10. The method according to claim 9 wherein the re-quantizing comprises:
    dithering the positive and the negative portions of the differential voltage signal.

11. The method according to claim 9 wherein the connecting of each pair of ADCs comprises:
    dynamically cross-switching, in a pseudo-random sequence, the connected pair of single-ended n-level flash analog-to-digital converters (ADCs) so that the signal leg input to each comparator is switched.

12. An improved differential flash analog-to-digital converter (ADC) for quantizing a difference between two received voltage signals, the improved flash ADC comprising:
    a pair of single-ended non-differential (n/2)-level flash ADCs, each having a reference level offset by one-half of one quantization step, each converting an associated one of the two received voltage signals into a digital signal having N/2 quantization levels; and
    a subtractor digitally subtracting the two digital signals to produce a difference signal having N−1 quantization levels.

13. An improved flash analog-to-digital converter (ADC) for quantizing a differential signal, the improved flash ADC comprising:
    a pair of single-ended (N/2)-level flash ADCs, each having a reference level offset by one-half of one quantization step, connected for digital common mode rejection (DCMR) by act of (i) independently quantizing both positive and negative portions of a differential signal output into positive and negative signal portions each of (N/2) levels, (ii) digitally subtracting the positive and the negative signal portions to produce a difference signal of N−1 levels in which difference signal a common mode noise component is canceled.

14. A method of realizing flash analog-to-digital conversion for quantizing a differential voltage signal, the improved A/D conversion method comprising:

connecting a pair of single-ended (N/2)-level flash analog-to-digital converters (ADCs) so that one ADC receives one leg, and the other ADC the other leg, of the differential voltage signal;

independently converting with the pair of ADCs both legs of the differential voltage signal so as to produce two digital signals each having a number N/2 of quantization levels; and digitally subtracting the two digital signals to produce a digital difference signal having N−1 quantization levels, in which (N−1)-level digital difference signal a common mode component is canceled.

15. An improvement to a plurality of two-terminal voltage comparators within a flash analog-to-digital converter (ADC) that serves to quantize an analog signal, the plurality of voltage comparators organized to compare the analog signal to a set of spaced reference voltage signals, each of the plurality of voltage comparators comparing an associated analog signal at one of its terminals to an associated reference voltage signal at its other terminal to generate a digital signal dependent upon whether a difference between the associated analog and voltage signals is greater than or less than an offset signal, the improvement comprising:

pseudo-randomly modulating the sense of the offset signals for the plurality of comparators by action of dynamically cross-switching, in a pseudo-random sequence between all the plurality of comparators, the analog signal and the reference voltage signal input to each comparator simultaneously that the polarity of the digital signal output from each comparator is also correspondingly switched;

wherein, by the cross-switching of both the input signals, and also the output signal, at each comparator polarity of the comparator output signal is unaffected;

wherein, by the pseudo-random cross switching of signals at all comparators, comparator carrier voltage offset errors are modulated in pseudo-random sequence, whitening the effect of these offset errors in a quantized differential signal produced by the plurality of comparators.

16. The improvement to the differential comparators of a flash ADC according to claim 15 wherein the pseudo-randomly modulating by action of dynamic cross-switching at all comparators is in response to a same one single pseudo-random signal.

17. The plurality of differential comparators improved in accordance with claim 15 used in a flash analog-to-digital converter (ADC) that is itself used in a mismatch-shaping multibit delta sigma (ΔΣ) modulator.

18. A mismatch-shaping multibit delta sigma (ΔΣ) modulator comprising:

a pair of single-ended multi-level-quantizing flash ADCs independently quantizing both positive and negative portions of a differential signal;

subtractor means for digitally subtracting the positive and the negative signal portions to produce a difference signal in which difference signal a common mode component is canceled;

signal quantizing means for producing a multi-level quantized representation of the differential signal in which representation common mode noise is canceled;

a digital-to-analog converter (DAC) for converting the multi-level quantized representation of the differential signal output to an analog signal fed back to the differential signal;

wherein the pair of single-ended multi-level-quantizing flash ADCs are connected for digital common mode rejection (DCMR).

19. The mismatch-shaping multibit delta sigma (ΔΣ) modulator according to claim 18 wherein each of the pair of single-ended multi-level-quantizing flash ADCs comprises:

a plurality of comparators; and means for dynamically cross-switching, in a pseudo-random sequence, all the plurality of comparators so that both a differential signal input to each comparator and a differential signal output by the same comparator are switched, leaving an output signal at each-comparator unaffected in polarity but modulating carrier voltage offset errors of all comparators in pseudo-random sequence;

wherein an effect of these offset errors in the quantized differential signal produced by the plurality of comparators is whitened.

* * * * *

UNITED STATES PATENT AND TRADEMARK OFFICE
CERTIFICATE OF CORRECTION

PATENT NO.    : 6,816,100 B1
DATED         : November 9, 2004
INVENTOR(S)   : Ian Galton, Eric Fogelman and Henrick T. Jensen It is certified that error appears in the above-identified patent and that said Letters Patent is hereby corrected as shown below:

Title page,
Item [75], Inventors, change "Henrick" to -- Henrik --.

Column 1,
Line 6, please insert the following new paragraph:
-- STATEMENT REGARDING FEDERALLY SPONSORED RESEARCH This invention was funded in part by Grant No. 9711331 awarded by NSF. The government may have certain rights in the invention. --

Signed and Sealed this

First Day of February, 2005

JON W. DUDAS
*Director of the United States Patent and Trademark Office*